(12) United States Patent
Hsu et al.

(10) Patent No.: US 11,249,384 B2
(45) Date of Patent: Feb. 15, 2022

(54) MASK FOR EUV LITHOGRAPHY AND METHOD OF MANUFACTURING THE SAME

(71) Applicant: TAIWAN SEMICONDUCTOR MANUFACTURING CO., LTD., Hsinchu (TW)

(72) Inventors: Pei-Cheng Hsu, Taipei (TW); Chi-Ping Wen, Hsinchu (TW); Tzu Yi Wang, Hsinchu (TW); Ta-Cheng Lien, Hsinchu County (TW); Hsin-Chang Lee, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 136 days.

(21) Appl. No.: 16/441,700

(22) Filed: Jun. 14, 2019

(65) Prior Publication Data

US 2020/0004133 A1    Jan. 2, 2020

Related U.S. Application Data

(60) Provisional application No. 62/692,585, filed on Jun. 29, 2018.

(51) Int. Cl.
*G03F 1/22* (2012.01)

(52) U.S. Cl.
CPC ..................................... *G03F 1/22* (2013.01)

(58) Field of Classification Search
CPC ..... G03F 1/22; G03F 1/24; G03F 1/26; G03F 1/38
See application file for complete search history.

(56) References Cited

U.S. PATENT DOCUMENTS

| 8,796,666 B1 | 8/2014 | Huang et al. |
| 9,093,530 B2 | 7/2015 | Huang et al. |

(Continued)

FOREIGN PATENT DOCUMENTS

JP    2011044520 A  * 10/2011

OTHER PUBLICATIONS

Kohler M. Isotropic Etching. (2008). Springer. Boston, MA. Encyclopedia of Microfluidics and Nanofluidics, pp. 877-884 (Year: 2008).*

(Continued)

*Primary Examiner* — John A McPherson
*Assistant Examiner* — Nicholas E Brown
(74) *Attorney, Agent, or Firm* — McDermott Will & Emery LLP

(57) ABSTRACT

A method of manufacturing an extreme ultraviolet (EUV) lithography mask includes forming an image pattern in an absorption layer of EUV mask blank. The EUV mask blank includes: a multilayer stack including alternating molybdenum (Mo) and silicon (Si) layers disposed over a first surface of a mask substrate, a capping layer disposed over the multilayer stack, and an absorption layer disposed over the capping layer. A border region surrounds the image pattern having a trench wherein the absorption layer, the capping layer and at least a portion of the multilayer stack are etched. Concave sidewalls are formed in the border region or an inter-diffused portion is formed in the multilayer stack of the trench.

20 Claims, 18 Drawing Sheets

(56) References Cited

U.S. PATENT DOCUMENTS

| | | |
|---|---|---|
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2004/0131947 A1* | 7/2004 | Fisch Gallagher ....... G03F 1/24 430/5 |
| 2009/0220869 A1* | 9/2009 | Takai ..................... B82Y 10/00 430/5 |
| 2014/0170536 A1* | 6/2014 | Fukugami ................. G03F 1/38 430/5 |

OTHER PUBLICATIONS

English Machine Translation of Abe et al. (JP201104452A) (Year: 2011).*

* cited by examiner

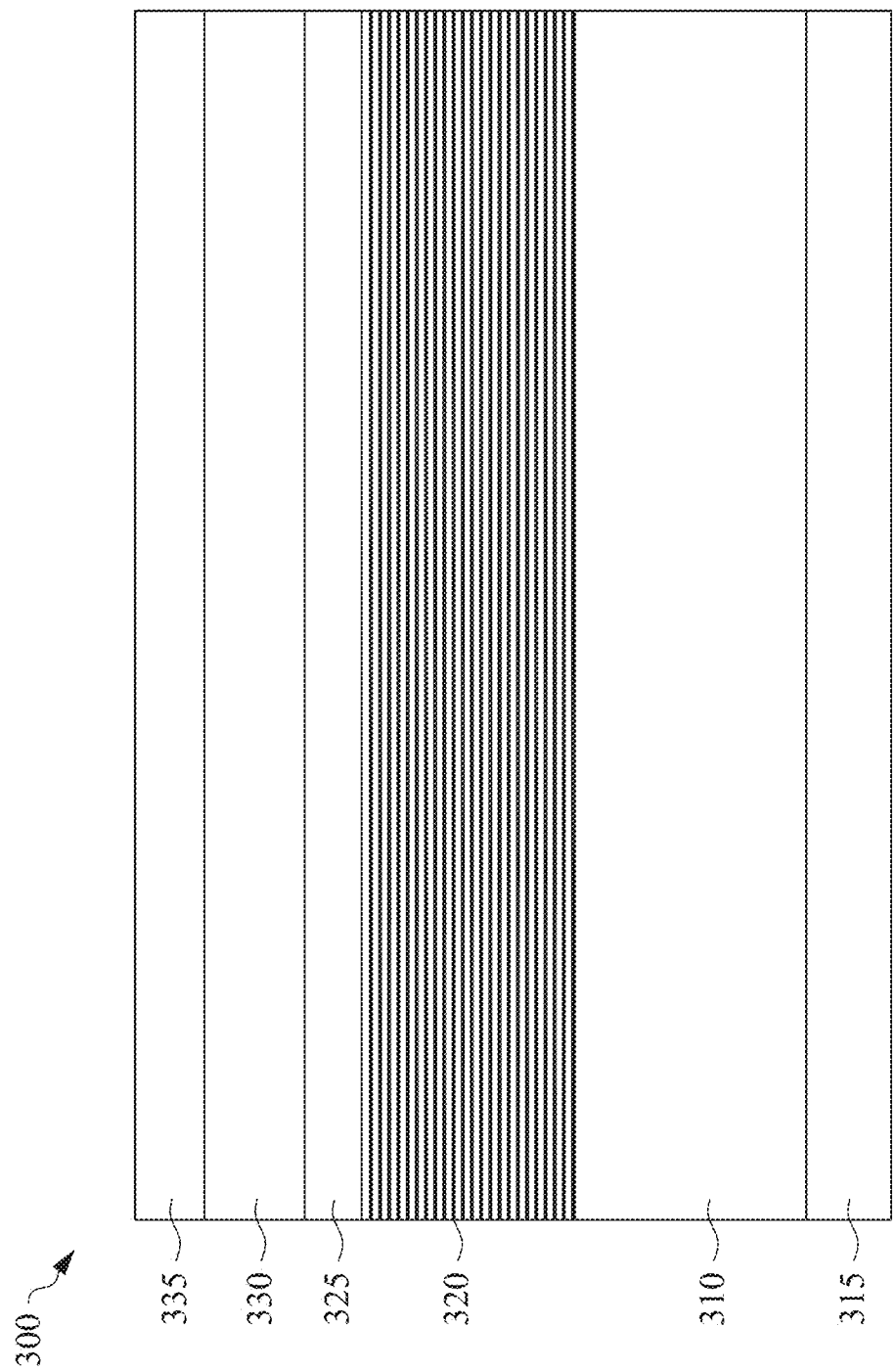

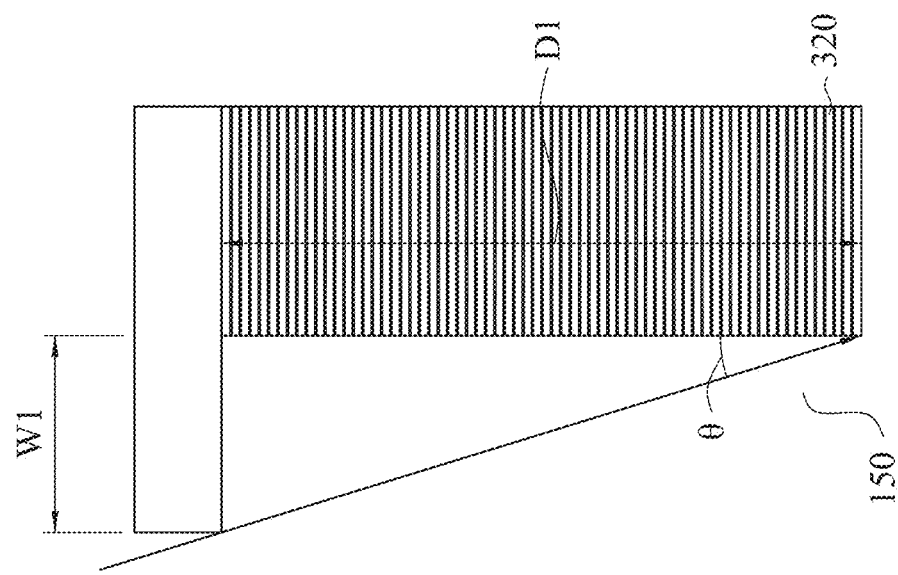
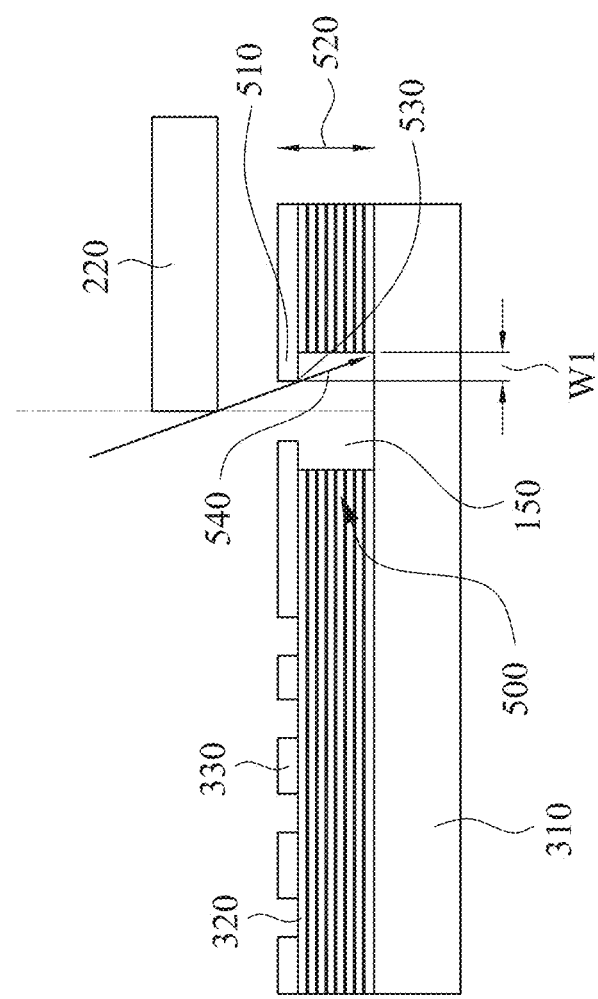
FIG. 5B
FIG. 5A

US 11,249,384 B2

MASK FOR EUV LITHOGRAPHY AND METHOD OF MANUFACTURING THE SAME

CROSS-REFERENCE TO RELATED APPLICATION

The present application claims priority to and incorporates by reference U.S. Provisional Application 62/692,585 filed on Jun. 29, 2018 in its entirety.

BACKGROUND

EUV lithography is the most promising technology for semiconductor device manufacturing of the 10 nm node and beyond. In EUV lithography, an EUV photo mask is one of the key elements. For an EUV photo mask, multiple mask parameters should be optimized to achieve precise and high resolution pattern forming in EUV lithography. Such parameters include, but are not limited to, an absorber height, optimum optical proximity effect corrections (OPC) needed for shadowing correction, an increase of reflectivity in image fields and optimum image borders.

EUV photo masks have a black border area surrounding a circuit pattern area, over which mask blades of an EUV lithography tool are placed. The black border is a pattern-free dark area around the die on the photomask serving as transition area between parts of the mask that are shielded from the exposure light by the reticle masking (REMA) blades and the die. When printing a die at dense spacing on an EUV scanner, the EUV light reflection from the image border overlaps edges of neighboring dies. This reflected light also contains various wavelengths that are not required, known as out-of-band (OOB) light. The OOB light adversely affects the accuracy of patterns to be formed on a substrate, in particular sections around the periphery of the pattern on the substrates. Additionally, leakage of EUV radiation occurs during exposure of adjacent dies because of residual absorber reflectivity and REMA blade instability, resulting in over exposure around die edges. To reduce this effect, a black border area is placed between adjacent dies. The black border area can solve critical dimension non-uniformity caused by neighboring die exposure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 schematically illustrates a cross-section of an EUV mask blank used for making an EUV mask having a black border region in accordance with some embodiments of the present disclosure.

FIGS. 5A and 5B schematically illustrate a cross-section of a concave sidewall of a black border region formed in accordance with some embodiments of the present disclosure.

DETAILED DESCRIPTION

Figure 1:
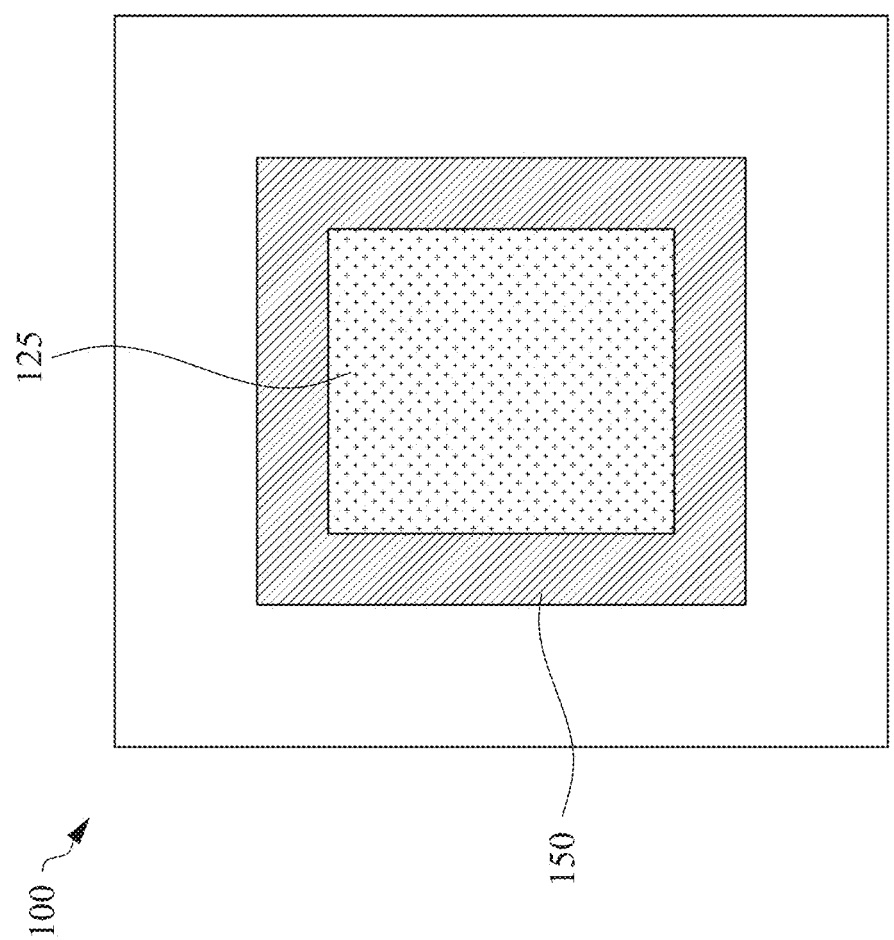
FIG. 1 schematically shows a black border formed around an image field in an EUV mask.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In EUV photolithography, the EUV light rays emitted from a plasma are reflected off a collector mirror, directed toward a patterned EUV mask, and reflected off the EUV mask onto the target substrate. An EUV reflective mask includes a substrate, an EUV reflective multilayered (ML) structure, and an EUV absorbing layer ('absorber'). The EUV absorbing layer is patterned by etching portions of the absorbing layer to expose the underlying ML structure in those portions to form a desired pattern. EUV radiation is reflected from the exposed ML structure on to a target substrate coated with an EUV resist. The portions of EUV absorbing layers left unetched absorb the EUV radiation so as not to reflect EUV radiation on to the target substrate, thereby forming the desired pattern on the target substrate.

The thickness of the EUV absorbing layer, the thickness of each of the layers in the ML structure, surface roughness of the above layers, and the homogeneity of the material properties throughout the layers determine the quality of EUV radiation irradiating the target substrate. In industrial practice, off-axis illumination or other factors can cause a shadow effect on the target substrate and variations in the thickness of the EUV absorbing layer can affect the proper functioning of the combination of the EUV absorbing layer and the ML structure.

FIG. 1 schematically shows a black border formed around an image field in an EUV mask. A black border region 150 is formed at the edge of the desired patterns (i.e., image field 125) of an EUV photomask 100. The black border region 150 inhibits over-exposure of the edge of the patterns in an adjacent die. The black border region 150 is a non-reflective area formed to prevent exposure of adjacent dies because of residual absorber reflectivity, off-axis reflection shadow effects, OOB light, etc.

Figure 2:
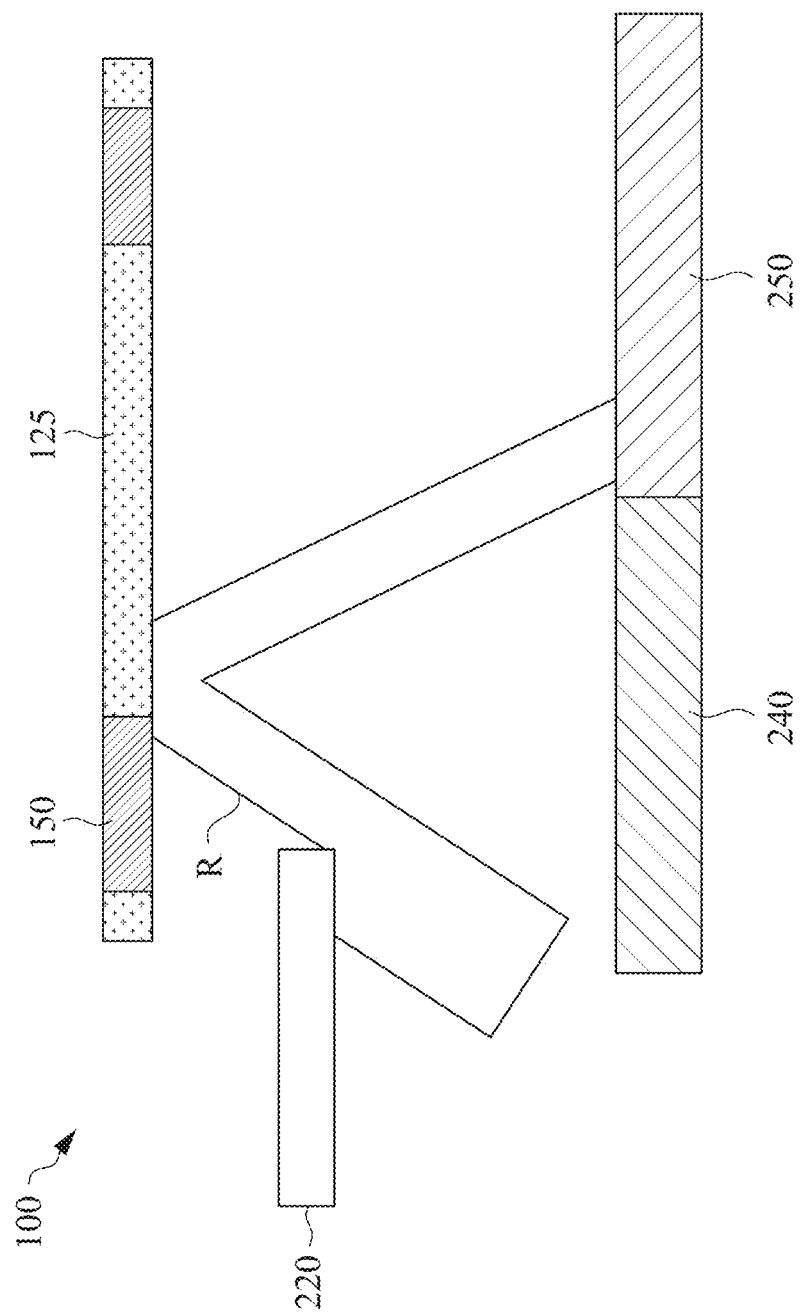
FIG. 2 schematically shows the effect of a black border region in reducing undesired exposure of adjacent dies.

As shown in FIG. 2, radiation R incident on the black border region 150 is absorbed by the black border region 150, thereby preventing exposure of the edge region of the adjacent die 240 adjacent to the die currently being exposed 250. In some embodiments, REMA blades 220 block a portion of the incident radiation R from the black border area surrounding the pattern 125. REMA blades 220 reduce the need for having a wide (i.e., expensive) border area, allowing a selected portion of the full patterned area to be exposed, and selectively blocking reticle alignment targets so that they are not printed on the wafer.

In some implementations, the black border region 150 is formed by etching an area surrounding the circuit pattern to form a non-reflective opening of sufficient depth for destructive interference of any reflected EUV radiation from that region. The additional etching step requires additional photolithography steps which increases the processing time and consequently increases the possibility of damaging the circuit pattern on the mask. Moreover, the additional etching step may also result in particulate residue diffusing on to the circuit pattern causing undesired defects. Such implementations of the black border are, therefore, susceptible to longer processing times and lower yield.

To alleviate some of these disadvantages, in some implementations, an area surrounding the circuit pattern is laser annealed from the back-side of the mask (i.e., substrate side rather than the pattern side) to intentionally change the ML structure and thereby, change the reflectivity of the ML structure at the desired wavelength. However, because the change in the reflectivity of the ML structure in such a process comes about due to physical and chemical changes induced by heat, it is difficult to precisely control the area in which such changes occur, thereby potentially damaging the image region. Alternate forms and methods of forming black border for an EUV mask are, therefore, desired.

The present disclosure generally relates to EUV masks, and in particular to a non-reflective black border region 150 for EUV masks, and methods for making EUV masks with the non-reflective black border. The EUV mask and methods of making the EUV masks provide for the formation of a black border region without substantial additional etching steps, thereby avoiding the problems of potentially damaging the image region due to, for example, particulate contamination during etching steps.

FIG. 3 schematically illustrates a cross-section of an EUV mask blank used for making an EUV mask 300 in accordance with some embodiments of the present disclosure. In some embodiments, the EUV mask 300 includes a multi-layered EUV reflective (ML) stack 320 disposed over a first major surface of a low thermal expansion material (LTEM) substrate 310. A capping layer 325 is disposed on the multilayer stack 320, and an absorption layer 330 is disposed over the capping layer 325.

In some embodiments, as depicted in FIG. 3, an antireflection layer 335 is disposed over the absorption layer 330, and a conductive backside coating layer 315 is disposed on the second major surface of the LTEM substrate 310 opposite the first major surface on which the multilayer stack 320 is disposed. The conductive backside coating layer 315 is used to fix the mask for photolithographic operation by electrostatic chucking in some embodiments. In some embodiments, the conductive layer 315 is formed of a ceramic compound including CrN, CrO, TaB, TaBN, TaBO, TaO, TaN, or any suitable material for electrostatic chucking of the mask.

The LTEM substrate 310 is made of a low thermal expansion glass material including titanium oxide doped silicon dioxide, or any other suitable low thermal expansion materials such as quartz, silicon, silicon carbide, and/or other low thermal expansion substances known in the art that can minimize the image distortion due to mask heating in the EUV photolithographic environment, in some embodiments. In some embodiments, the LTEM substrate 310 has a low defect level, such as a high purity single crystal substrate, and a low level of surface roughness, as measured using an atomic force microscope.

The multilayer stack 320 includes alternating Mo layers and Si layers deposited over the LTEM substrate 310. The multilayer stack 320 provides Fresnel resonant reflections across the interfaces between the Mo layer and Si layer of different refractive indices by use of an appropriate thickness for each layer inside the ML structure. High quality reflections rely on constructive interference by phase-matching and intensity adding-up of light rays reflected from different layers. The thickness of the layers depends on the wavelength of the incident light and the angle of incidence to the EUV mask 300. For a specific angle of incidence, the thickness of each of the layers of the multilayer stack 320 is chosen to achieve maximal constructive interference for light reflected at different interfaces of the multilayer stack 320. Thus, even thickness and low surface roughness of each of the layers in the multilayer stack 320 are required for high quality Fresnel resonant reflections. A thickness of each of the layers in the multilayer stack 320 is 3 nm to 7 nm in some embodiments.

In some embodiments of the present disclosure, the multilayer stack 320 includes alternating molybdenum layers and beryllium layers. In some embodiments, the number of layers in the multilayer stack 320 is in a range from 20 to 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 320 includes about 30 to about 60 alternating layers of Mo and Si (or Be). In other embodiments of the present disclosure, the multilayer stack 320 includes about 40 to about 50 alternating layers each of Mo and Si (or Be).

Methods of forming the layers of the multilayer stack 320 include, but are not limited to, physical vapor deposition (PVD) processes such as evaporation, RF or DC sputtering;

chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods such as a sol-gel method and metal-organic decomposition; and/or any other suitable method known in the art.

The capping layer 325 formed over the multilayer stack 320 prevents oxidation of the multilayer stack 320 in some embodiments. In some embodiments, the capping layer 325 is formed of a material such as, for example, silicon and ruthenium. In some embodiments, the capping layer 325 has a thickness in a range from about 2 nm to about 7 nm. Methods of forming the capping layer 325 include, without limitation, ion beam deposition (IBD); physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

The absorption layer 330 formed over the capping layer 325 absorbs radiation having a wavelength in a range of EUV wavelengths, e.g., at 13.5 nm. The absorption layer 330 is formed of a single layer or multiple layers in some embodiments of the present disclosure. In some embodiments, the absorption layer 330 is formed of a material including a tantalum compound. In some embodiments, the absorption layer 330 is formed of TaN, TaBN, or TaBN. In some embodiments, the material used to make the absorption layer 330 also includes molybdenum, palladium, zirconium, nickel, nickel oxide, nickel silicide, titanium, titanium nitride, chromium, chromium oxide, aluminum oxide, aluminum-copper alloy, or other suitable materials.

Methods of forming the absorption layer 330 include, but are not limited to, physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

The anti-reflection layer 335 disposed over the absorption layer 330 is formed of a material including $SiO_2$, SiN, TaBO, TaO, CrO, ITO (indium tin oxide), or any suitable material, in some embodiments. The antireflection layer 335 reduces residual reflection from the absorption layer 330. In some embodiments, the antireflection layer 335 is formed of an EUV absorber material different from that of the absorption layer 330. In other embodiments, the antireflection layer 335 changes a phase of any EUV radiation reflected from the absorption layer 330 so as to reduce the intensity of the reflected EUV radiation via destructive interference.

Methods of forming the anti-reflection layer 335 include, for example, physical vapor deposition (PVD) processes, such as evaporation, RF or DC sputtering; chemical vapor deposition (CVD) processes such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition; and/or any other suitable method known in the art.

An aspect of the present disclosure is a method of fabricating an EUV mask having a black border region surrounding an image region. FIGS. 4A, 4B, 4C, 4D, 4E, and 4F show a method of fabricating an EUV mask in accordance with some embodiments of the present disclosure. In some embodiments, the method of fabricating an EUV mask includes, as shown in FIG. 4A, forming a hardmask layer 340 and a first resist layer 202 on a mask blank 305.

In some embodiments, the antireflective layer 335 is used as the hardmask layer 340. In some embodiments, materials suitable for forming the hardmask layer 340 include, but are not limited to, silicon dioxide, silicon nitride, spin-on carbon, spin-on oxide, CrO, CrN, CrON, TaO, TaN, Ru, RuN, RuB, TaB, TaBN, TaBO and their oxynitrides, etc. The material for the hardmask 340 is not limited so long as it is different from (and has etch selectivity over) that of the absorption layer 330. The hardmask layer 340, in various embodiments, has a thickness in a range from about 1 nm to about 100 nm. Methods of forming the hardmask layer 340 include, but are not limited to, physical vapor deposition (PVD) processes, such as evaporation, RF or DC sputtering; chemical vapor deposition (CVD) processes, such as atmospheric-pressure, low-pressure, plasma-enhanced, and high-density plasma CVD; atomic layer deposition (ALD); ion beam deposition; and liquid-phase non-vacuum methods, such as a sol-gel method and a metal-organic decomposition, and/or any other suitable method known in the art.

The first resist layer 202 is formed over the hardmask layer 340. Examples of suitable resist materials for the first resist layer 202 include, without limitation, e-beam resists such as, for example, PMMA, or other commercially available positive tone or negative tone e-beam resists; or photoresists such as, for example, SU8 or other commercially available positive tone or negative tone photoresists. The first resist layer 202 is coated onto the hardmask layer 340 by a spin coating technique followed by baking (Post Exposure Baking), in some embodiments.

As shown in FIG. 4A, the first resist layer 202 is exposed to actinic radiation and a developer to form an image pattern 210. In some embodiments, the actinic radiation includes an electron beam, while in other embodiments, the actinic radiation includes deep ultraviolet (DUV). In embodiments where the actinic radiation includes an electron beam, the first resist layer is formed of an e-beam resist such as PMMA. The image pattern is formed, for example, by a direct write process where a tightly focused electron beam is scanned across the surface of the first resist layer such that only the area corresponding to the image pattern is exposed to the electron beam. The e-beam resist is then developed to form the image pattern in the first resist layer.

Figure 4B:
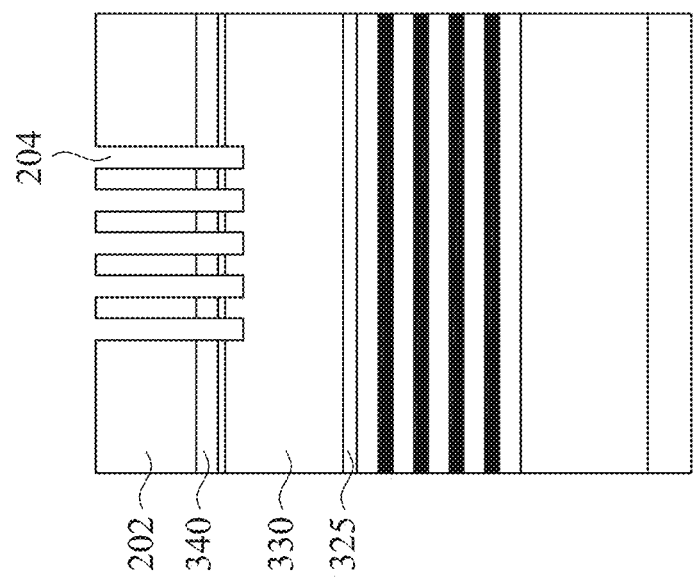
FIGS. 4A, 4B, 4C, 4D, 4E, and 4F schematically illustrate cross-sections of various stages during a process of fabricating an EUV mask with a black border in accordance with some embodiments of the present disclosure.
Figure 4A:
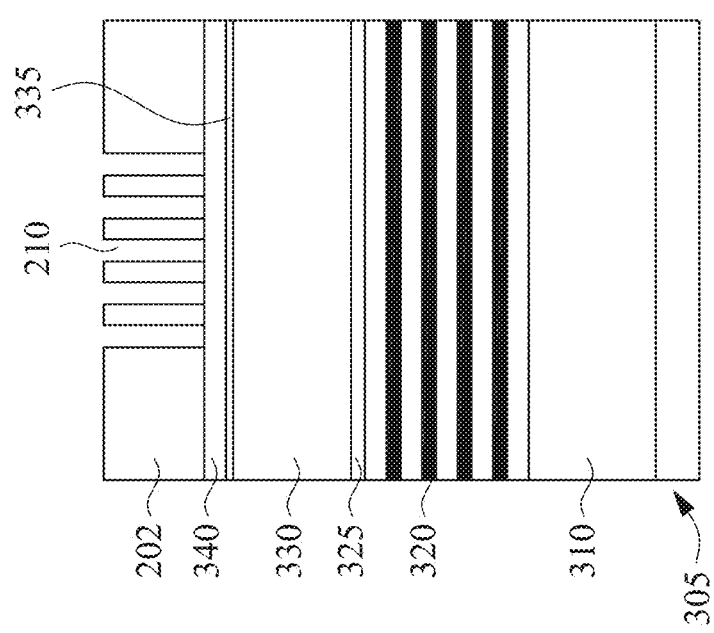

The image pattern 210 formed in the first resist layer 202 is extended, as shown in FIG. 4B, to the hardmask 340 by removing the portions of hardmask exposed through the image pattern 210. In some embodiments, the exposed portions of hardmask are removed by performing dry and/or wet etching of the hardmask 340 using a suitable etchant. In other embodiments, the exposed portions of hardmask are removed using, for example, ion milling, or other suitable techniques. Once the image pattern is formed in the hardmask, the first resist layer 202 is removed in some embodiments.

Figure 4D:
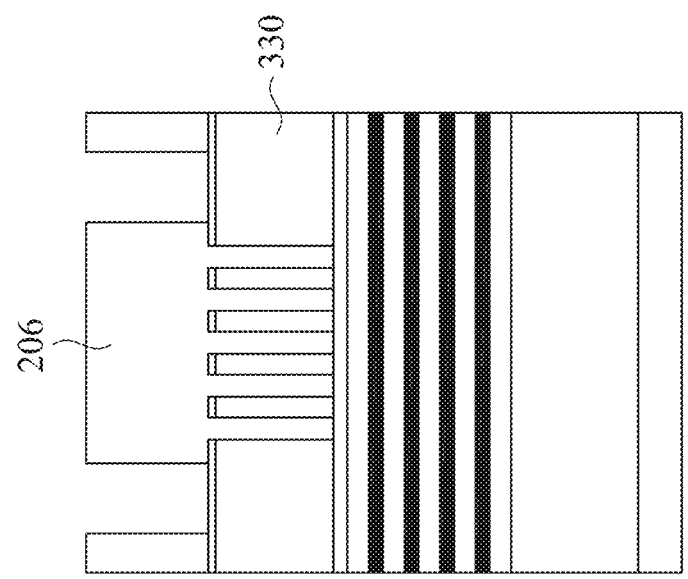
Figure 4C:
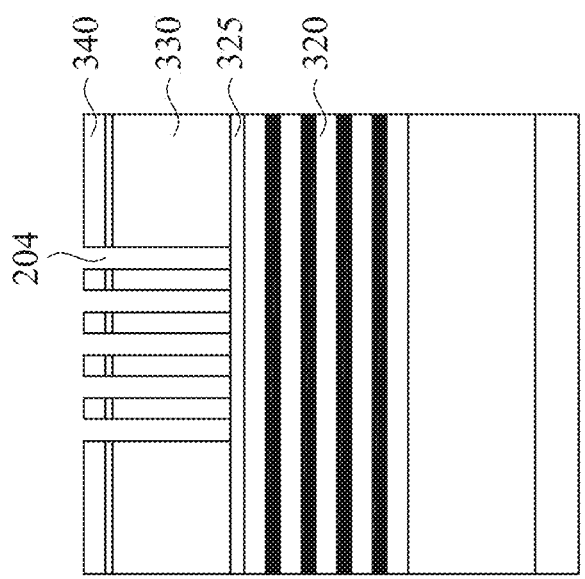

Subsequently, the layers underneath the hardmask layer 340 including, for example, the absorption layer 330 is etched, thereby forming first openings 204 that expose portions of the absorption layer 330. In some embodiments, the absorption layer 330 includes a bilayer of TaBO and TaBN. As shown in FIG. 4C, the remaining photoresist layer 202 is stripped and subsequently the hardmask 340 is also removed prior to moving to the next operation shown in FIG. 4D. Then, a second photoresist layer 206 is deposited on the absorption layer 330. Subsequently, the second photoresist layer 206 is patterned to expose portions of the absorption layer 330, as illustrated in FIG. 4D.

Figure 4E:
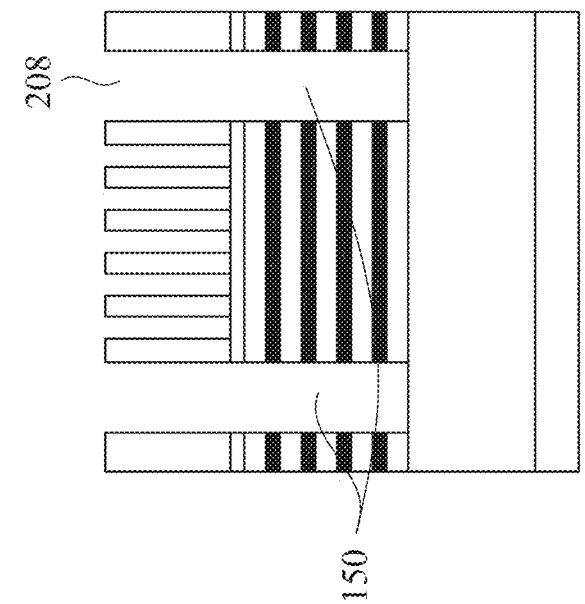
Figure 4F:
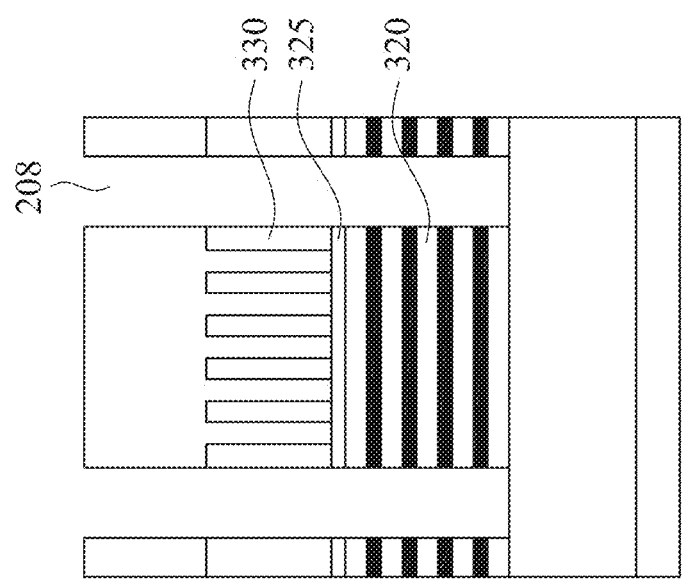

As illustrated in FIG. 4E, following the second photoresist layer 206 being patterned, another etching operation is performed to remove portions of the absorption layer 330. The etching operation also removes portions of the capping layer 325 and the multilayer stack 320 not covered by the second photoresist layer 206. As a result, black border openings 208 are formed over the multilayer stack 320 exposing portions of the multilayer stack 320 exposed by the black border openings 208 to form the black border region 150. As illustrated in FIG. 4F, the second photoresist layer 206 is subsequently stripped.

FIG. 5A illustrates an exemplary EUV mask 300 including a concave sidewall 500 formed in accordance with some embodiments of the present disclosure. The EUV mask 300 includes a substrate made with a suitable material, such as a low thermal expansion material (LTEM). In various examples, the LTEM includes fused quartz, $TiO_2$ doped $SiO_2$, or other suitable materials with low thermal expansion. The EUV mask 300 includes reflective multiple layers (ML) deposited on the substrate. The ML includes a plurality of film pairs, such as molybdenum-silicon (Mo/Si) film pairs (e.g., a layer of molybdenum above or below a layer of silicon in each film pair). The EUV mask may further include a capping layer, such as ruthenium (Ru), disposed on the ML for protection. The EUV mask further includes an absorption layer, such as a tantalum boron oxide and/or tantalum boron nitride (TaBO/TaBN) layer, deposited over the ML. The absorption layer is patterned to define a layer of an integrated circuit (IC).

The concave sidewall 500 includes at least one protruding portion 510 that extends substantially perpendicular to a stacking direction 520 of the multilayer stack 320. The at least one protruding portion 510 of the concave sidewall 500 prevents direct EUV light irradiation on the multilayer stack 320 of the black border region 150. The concave sidewall 500 may be formed by isotropically etching the multilayer stack 320 to create a concavity 540 in the black border region 150. In such some embodiments, the at least one protruding portion 510 prevents the direct EUV light irradiation to the multilayer stack 320 of the black border region 150. The at least one protruding portion 510 may be of any appropriate shape, size, type or configuration. In some embodiments, the at least one protruding portion 510 may further include a tapered profile 530. In some embodiments, a width W1 of the at least one protruding portion 510 is in a range from about 10 nm to about 50 nm.

As shown in FIG. 5B, an amount W1 of the at least one protruding portion 510 of the absorption layer 330 is determined by the thickness, D1, of the multilayer stack 320 and an incident angle θ of the EUV light in some embodiments. Because the EUV light is incident on the EUV mask with some angle (θ≠0), if W1 is small (≈0), the EUV light may be reflected by the multilayer stack 320 in the black border region 150. When W1 satisfies W1≥D1*tan θ, the EUV light entering the black border region 150 is not reflected by multilayer stack 320. In some embodiments, an angle (θ) is in a range from about 5 degrees to about 10 degrees (0.087 rad~0.174 rad), e.g. 6 degrees.

Figure 6B:
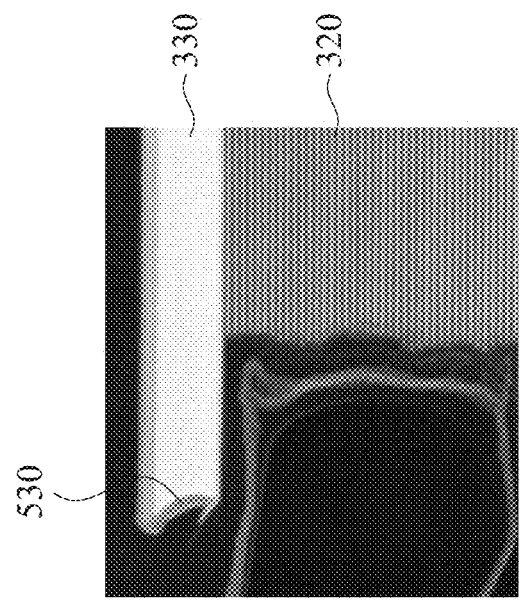
FIG. 6B illustrates a portion of an EUV mask having a black border region in accordance with some embodiments of the present disclosure.
Figure 6A:
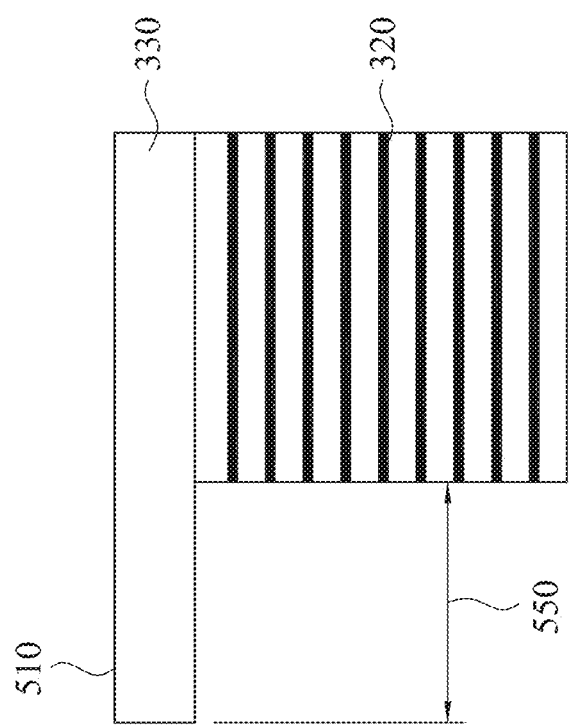
FIG. 6A schematically illustrates a portion of an EUV mask having a black border region in accordance with some embodiments of the present disclosure.

As shown in FIG. 6A, the at least one protruding portion 510 may comprise a material selected from the group consisting of TaBO, TaBN, or a combination thereof. In some embodiments, the width W1 of the at least one protruding portion 510 between one end of TaBO/TaBN layer 330 and one end of the multilayer stack 320 is greater than about 29 nm.

Figure 6C:
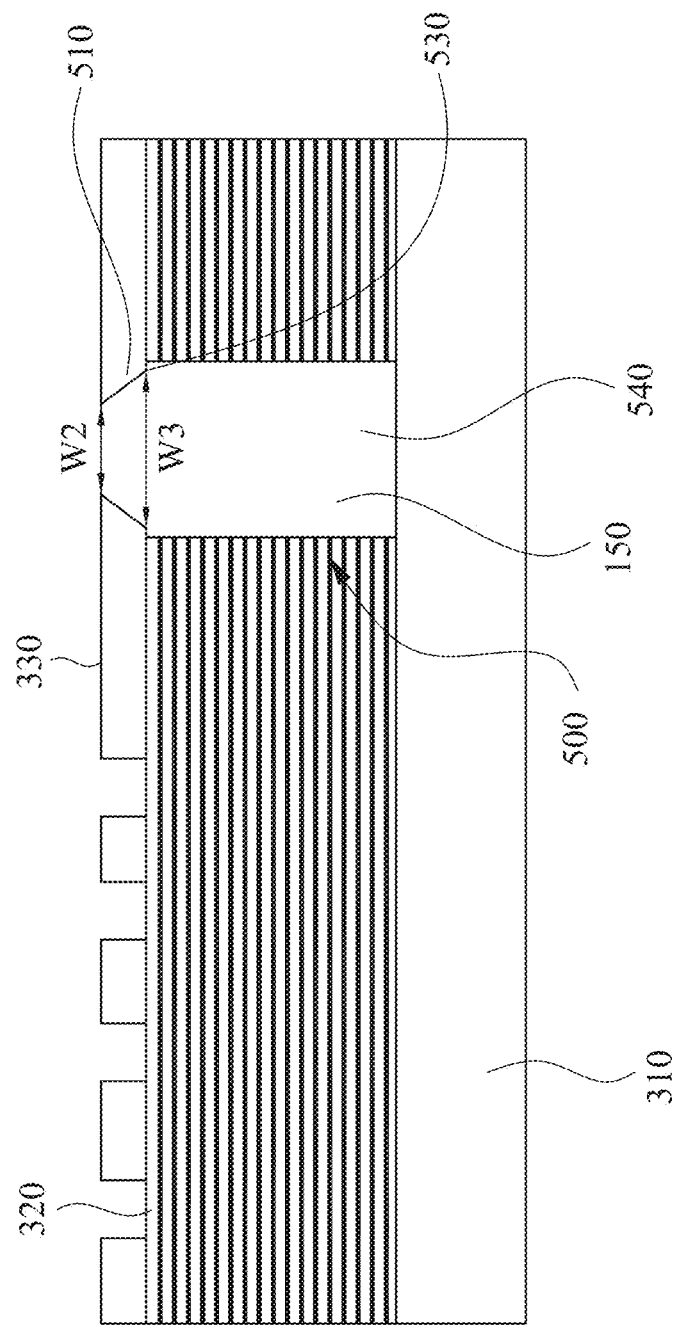
FIG. 6C illustrates a portion of an EUV mask having a black border region in accordance with some embodiments of the present disclosure.

As shown in FIG. 6B, the absorption layer 330 and the multilayer stack 320 are isotropically etched to create the protruding portion 510 with a tapered profile 530 by over-etching. Thus, for example, if the width of the opening in the top of the protruding portion 510 is W2, and the width of the opening of the bottom of the protruding portion 510 is W3, then W3>W2, as shown in FIG. 6C. In other words, the isotropic etching etches more of the bottom portion of the absorption layer 330 than is exposed in the top portion of the absorption layer 330. In some embodiments, the tapered profile 530 of the at least one protruding portion 510 is formed by isotropic etching.

Another embodiment of the disclosure is a method of manufacturing an extreme ultraviolet (EUV) lithography mask. As shown in FIGS. 7A-7G, the method includes forming an inter-diffused portion 600 that exhibits a reduced EUV reflectivity and thereby preventing critical dimension errors at die edges. The inter-diffused portion 600 has a non-periodic structure of silicon (Si) and molybdenum (Mo) in the multilayer stack 320 such that reflection of EUV light irradiation is significantly reduced. FIGS. 7A-7G schematically illustrate cross-sections of various stages during a process of fabricating an EUV mask with the inter-diffused portion 600 in accordance with some embodiments of the present disclosure. It is understood that additional operations can be provided before, during, and after processes shown by FIGS. 7A-7G, and some of the operations described below can be replaced or eliminated, for additional embodiments of the method. The order of the operations/processes may be interchangeable.

Figure 7B:
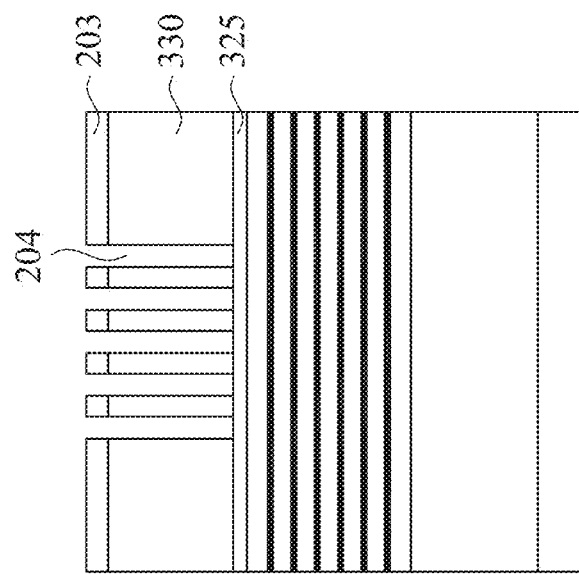
FIGS. 7A, 7B, 7C, 7D, 7E, 7F, and 7G schematically illustrate cross-sections of various stages during a process of fabricating an EUV mask with a black border in accordance with some embodiments of the present disclosure.
Figure 7A:
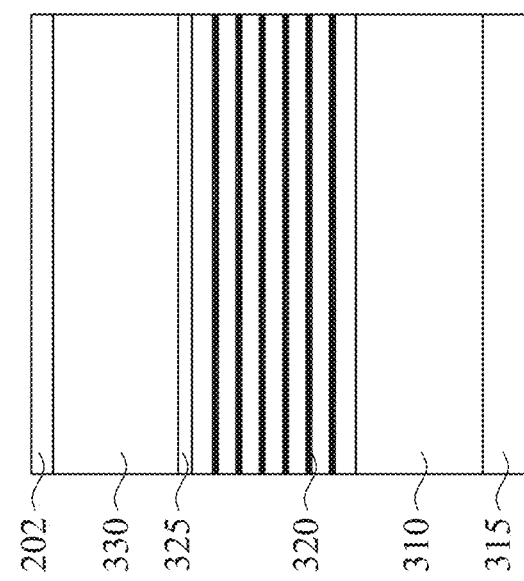
Figure 7D:
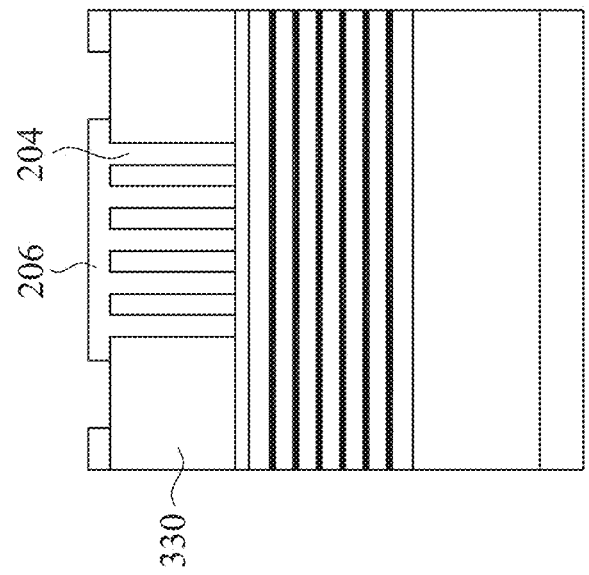
Figure 7C:
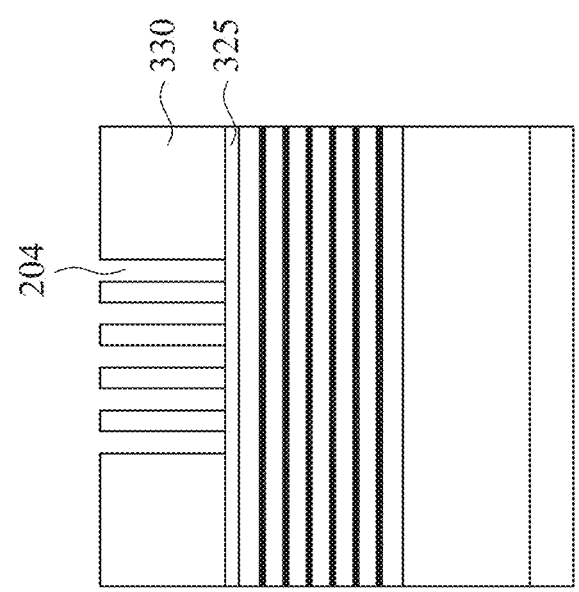
Figure 7F:
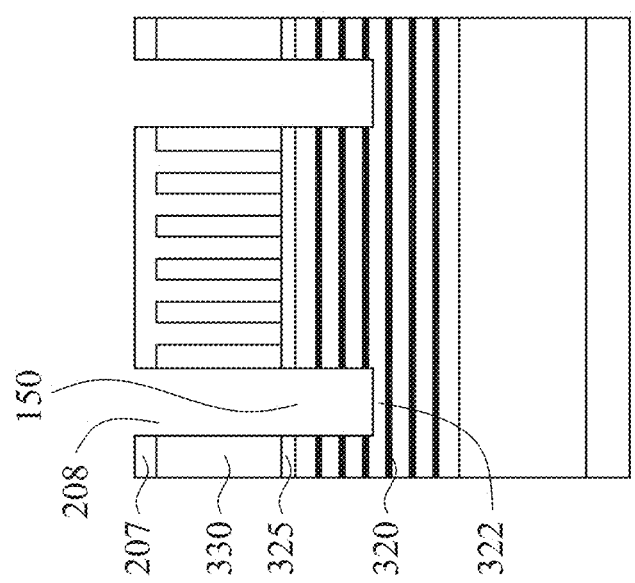

In operation, a photoresist layer 202 is deposited on the absorption layer 330, as shown in FIG. 7A, and patterned using desired patterning techniques including, for example, electron-beam lithography. Then, as illustrated in FIG. 7B, an etching operation is performed to remove portions of the absorption layer 330 by the patterned photoresist layer 203, thereby forming first openings 204 that correspond to circuit patterns and expose portions of the capping layer 325. After the first openings 204 are formed, the remaining patterned photoresist layer 203 is then stripped as shown in FIG. 7C. Subsequently, a second photoresist layer 206 deposited on the absorption layer 330 covering the first openings 204 in the absorption layer 330. The second photoresist layer 206 is then patterned, as shown in FIG. 7D, to expose the absorption layer 330, the capping layer 325, and portion of the multilayer stack 320.

Figure 7E:
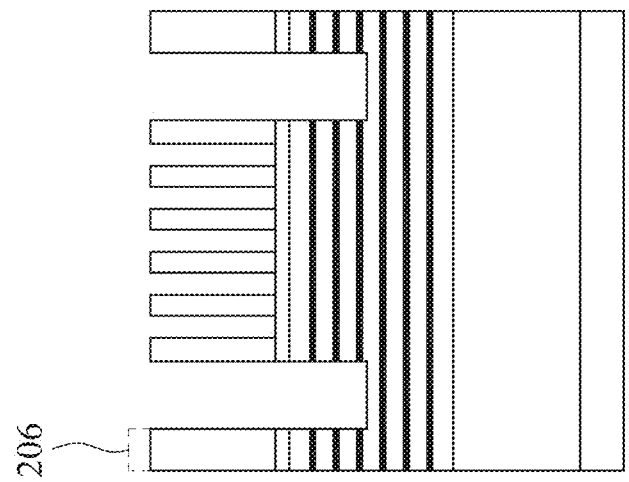

After the second photoresist layer 206 is patterned, another etching operation is performed, as shown in FIG. 7E, to remove the absorption layer 330, the capping layer 325 and portion of the multilayer stack 320 that are not covered by patterned second photoresist layer 207. As a result, black border openings 208 are formed, over the multilayer stack 320 exposing portions 322 of the multilayer stack in the black border openings 208, thereby forming the black border region 150. In an operation shown in FIG. 7F, the second photoresist layer 206 is stripped.

Figure 7G:
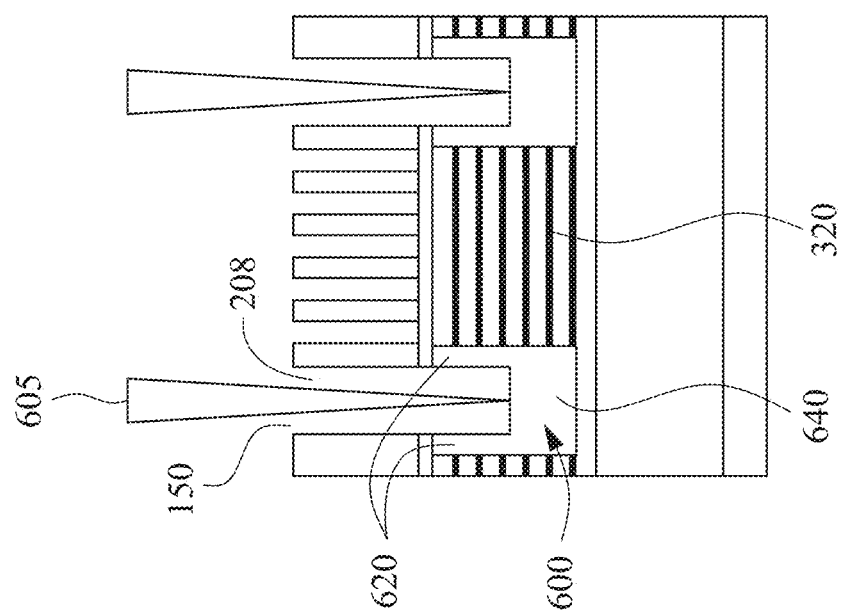

After the second photoresist layer 206 is patterned, a treatment by laser radiation 605 is performed to form the inter-diffused portion 600 in the black border region 150 as shown in FIG. 7G. Heat generated by the laser radiation 605, more specifically, a pulsed laser radiation 610 causes a diffusion of silicon (Si) and molybdenum (Mo) in the multilayer stack 320, thereby creating a Si—Mo inter-diffused portion 600 of the multilayer stack 320. In some embodiments, the inter-diffused portion 600 may include vertical inter-diffusion walls 620 over the multilayer stack 320. In some embodiments, and the inter-diffused portion 600 may also include a horizontal inter-diffusion wall 640.

In some embodiments shown in FIGS. 7A-7G, the multilayer stack 320 is partially treated by laser radiation 605 to form inter-diffused portion 600 showing non-periodic structure of Si—Mo material that exhibits substantially less reflectivity than the periodic multilayer stack 320, thereby enhancing the black border effect.

In some embodiments, the pulsed laser radiation 610 has a wavelength in a range from about 266 nm to about 1523 nm. In some embodiments, the laser resolution is in a range from about 0.1 µm to about 250 µm. In some embodiments, the position accuracy of the laser is in a range from about 0.01 µm to about 1 µm. In some embodiments, the laser has a pulse duration in a range from about 0.1 ns to about 2 ms. In some embodiments, the heat from the laser diffuses laterally a distance in a range from about 0.1 µm to about 10 µm.

FIGS. 8A-8G schematically illustrate cross-sections of various stages during a process of fabricating an EUV mask with the black border region 150 in accordance with an alternative embodiment of the present disclosure. In such embodiments, similar treatment by laser radiation 605 is performed after completely etching the multilayer stack 320 to expose the substrate 310 using an anisotropic etching process to form openings 208 in the black border region 150. The laser parameters for such embodiments are in the same range as those in the process described with reference to FIG. 7G.

Figure 8B:
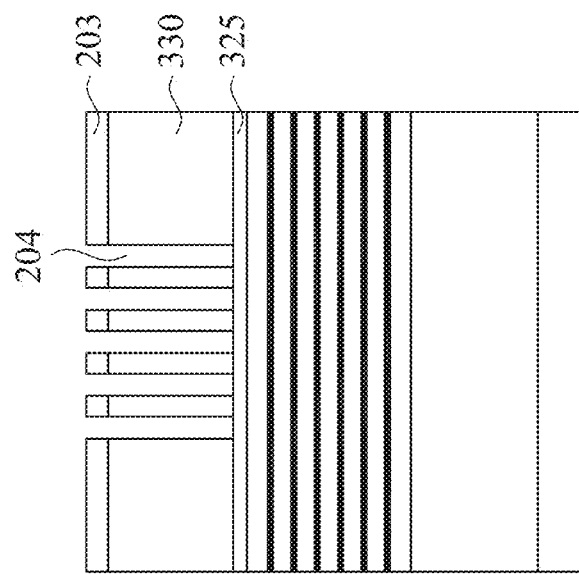
FIGS. 8A, 8B, 8C, 8D, 8E, 8F, and 8G schematically illustrate cross-sections of various stages during a process of fabricating an EUV mask with a black border in accordance with some embodiments of the present disclosure.
Figure 8A:
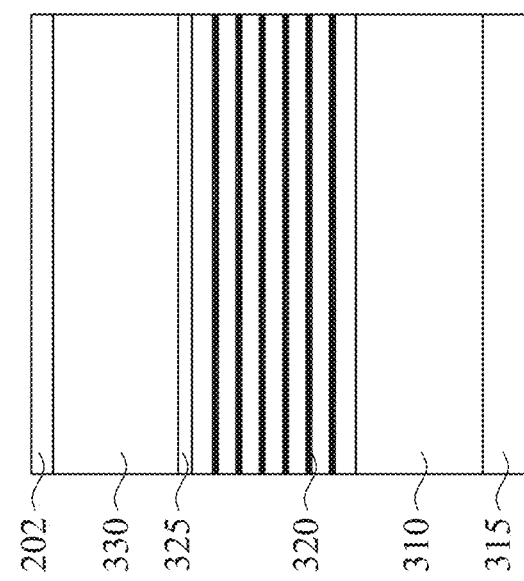
Figure 8D:
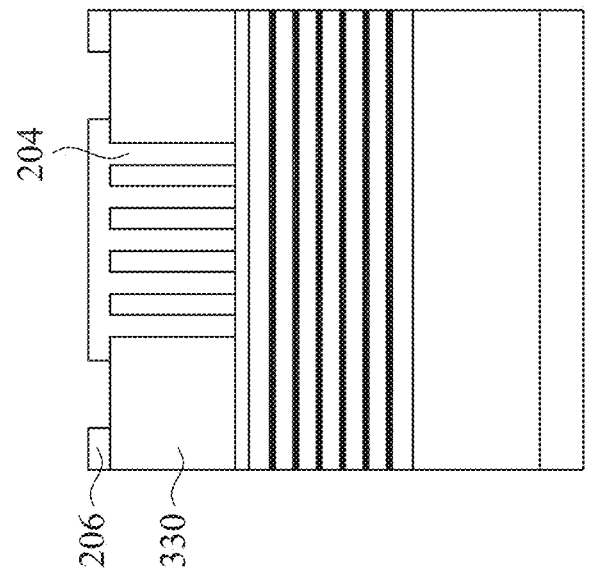
Figure 8C:
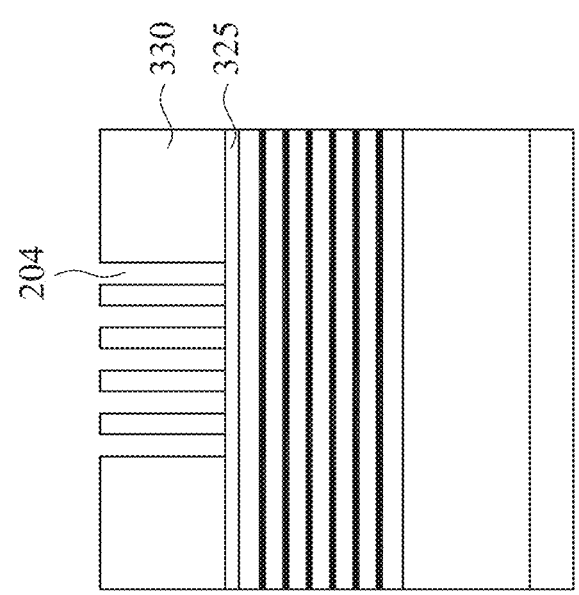
Figure 8F:
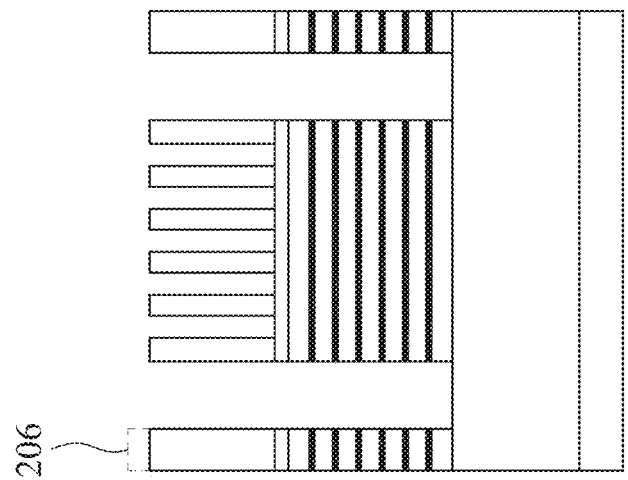

A photoresist layer 202 is deposited on the absorption layer 330, as shown in FIG. 8A, and patterned using desired patterning techniques including, for example, electron-beam lithography, photolithography, and the like. Then, as illustrated in FIG. 8B, an etching operation is performed to remove portions of the absorption layer 330 by the patterned photoresist layer 203, thereby forming first openings 204 that expose portions of the capping layer 325. After the first openings 204 are formed, the remaining patterned photoresist layer 203 is then stripped as shown in FIG. 8C. Subsequently, a second photoresist layer 206 deposited on the absorption layer 330 covering the first openings 204 in the absorption layer 330. The second photoresist layer 206 is then patterned, as shown in FIG. 8D, to expose the absorption layer 330, the capping layer 325, and portion of the multilayer stack 320.

Figure 8E:
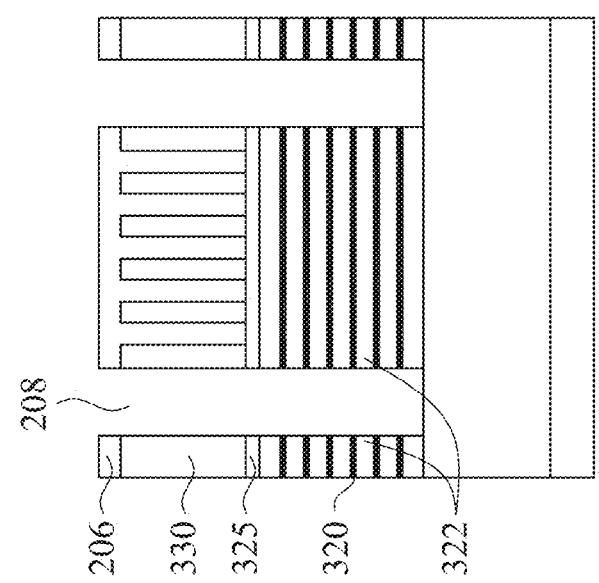

After the second photoresist layer 206 is patterned, another etching operation is performed, as shown in FIG. 8E, to remove the absorption layer 330, the capping layer 325 and portion of the multilayer stack 320 that are not covered by patterned second photoresist layer 207. As a result, black border openings 208 are formed, over the multilayer stack 320 exposing portions 322 of the multilayer stack in the black border openings 208, thereby forming the black border region 150. In an operation shown in FIG. 8F, the second photoresist layer 206 is stripped.

Figure 8G:
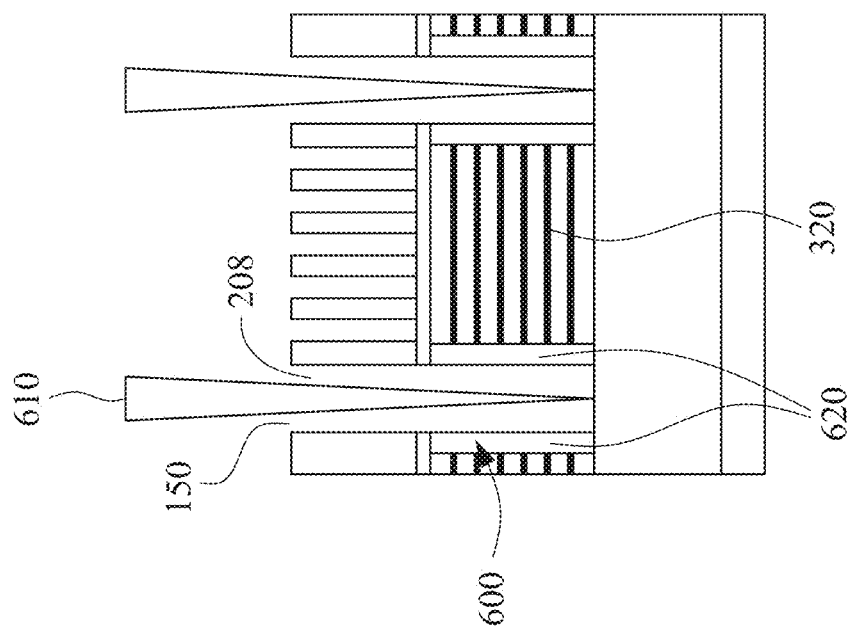

After the second photoresist layer 206 is patterned, the treatment by the pulsed laser radiation 610 is performed to form the inter-diffused portion 600 in the black border region 150 as shown in FIG. 8G. Heat generated by the pulsed laser radiation 610 causes a diffusion of silicon (Si) and molybdenum (Mo) in the multilayer stack 320, thereby creating a non-periodic Si—Mo inter-diffused portion 600 of the multilayer stack 320. In some embodiments, the inter-diffused portion 600 may only include the vertical inter-diffusion walls 620 over the multilayer stack 320.

In the embodiment shown in FIGS. 8A-8G, the multilayer stack 320 is completely etched using the anisotropic etching process to form inter-diffused portion 600 having non-periodic structure of amorphous Si—Mo material that exhibits substantially less reflectivity than the multilayer stack 320, thereby enhancing the black border effect.

Figure 9:
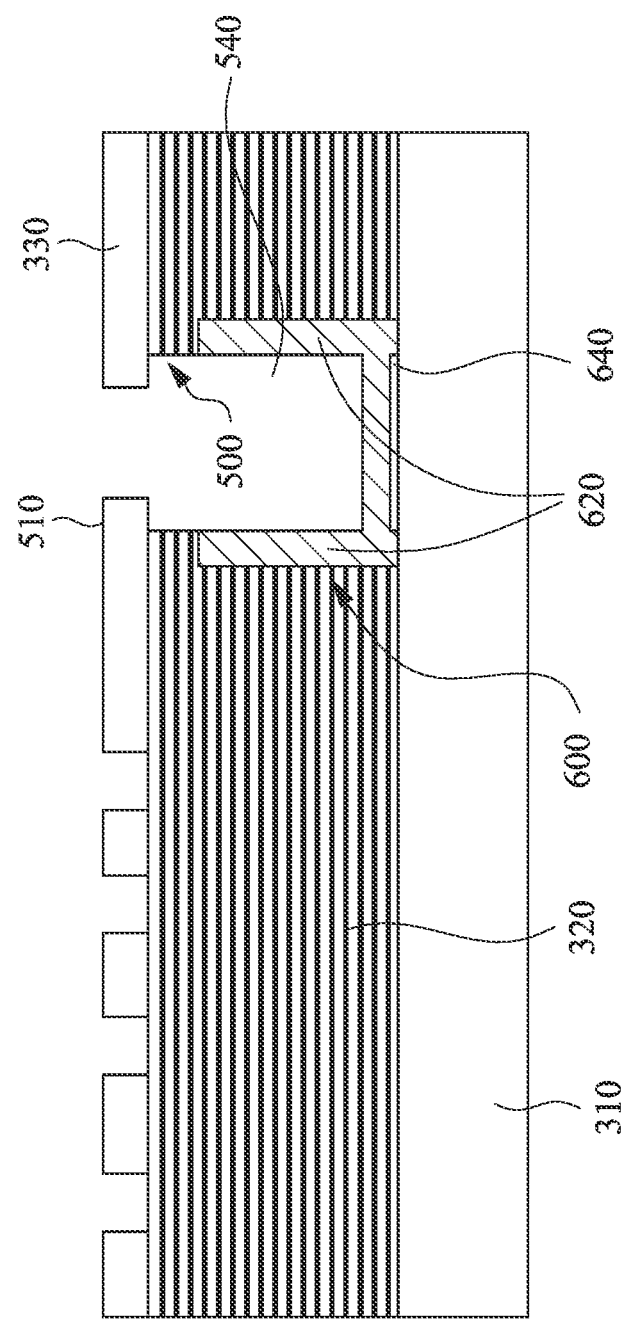
FIG. 9 schematically illustrates a cross-section of a concave sidewall and an inter-diffused portion of a black border region formed in accordance with some embodiments of the present disclosure.

FIG. 9 illustrates an exemplary EUV mask including the concave sidewall 500 and the inter-diffused portion 600 formed in accordance with some embodiments of the present disclosure. In such embodiment, the inter-diffused portion 600 is disposed on the concavity 540. In some embodiments, the inter-diffused portion 600 may include vertical inter-diffusion walls 620 over the multilayer stack 320. In some embodiments, and the inter-diffused portion 600 may also include a horizontal inter-diffusion wall 640. In some embodiments, the inter-diffused portion 600 may only include the vertical inter-diffusion walls 620 over the multilayer stack 320.

The various aspects described in the present disclosure provide an EUV mask with the black border region 150 surrounding an EUV mask pattern that reduces an undesired exposure of adjacent dies on a substrate to be exposed to EUV radiation. It will be understood that not all advantages have been necessarily discussed herein, no particular advantage is required for all embodiments or examples, and other embodiments or examples may offer different advantages.

An embodiment of the disclosure is a method of manufacturing an extreme ultraviolet (EUV) lithography mask. The method includes forming an image pattern in an absorption layer of EUV mask blank, in which the EUV mask blank includes a multilayer stack comprising alternating molybdenum (Mo) and silicon (Si) layers over a first surface of a mask substrate. A capping layer is disposed over the multilayer stack. An absorption layer is disposed over the capping layer. A border region that surrounds the image pattern and has a trench is formed, in which the absorption layer, the capping layer and at least a portion of the multilayer stack are etched. Subsequently, concave sidewalls are formed in the border region. In some embodiments, the concave sidewalls include a protruding portion. In some embodiments, the protruding portion comprises a material selected from the group consisting of TaBO, TaBN, or a combination thereof. In some embodiments, the protruding portion has a width in a range of 10 nm to 50 nm. The protruding portion of the concave sidewalls has a length greater than 29 nm, in some embodiments. In some embodiments, the protruding portion has a tapered profile.

Another embodiment of the disclosure is a method of manufacturing an extreme ultraviolet (EUV) lithography mask. The method includes forming an image pattern in an absorption layer of EUV mask blank, in which the EUV mask blank includes a multilayer stack comprising alternating molybdenum (Mo) and silicon (Si) layers over a first surface of a mask substrate. A capping layer is disposed over the multilayer stack. An absorption layer is disposed over the capping layer is formed. A border region that surrounds the image pattern and has a trench is formed, in which the absorption layer, the capping layer and at least a portion of the multilayer stack are etched. Subsequently, an inter-diffused portion is formed over the multilayer stack of the trench. In some embodiments, the multilayer stack is completely etched in the border region to expose the mask substrate. In some embodiments, the multilayer stack is partially etched so that a portion of the multilayer stack covers the substrate in the trench. In some embodiments, the inter-diffused portion is formed by a laser annealing operation. In some embodiments, the laser has a wavelength in a range from 266 nm to 1523 nm. The laser resolution is in a range from 0.1 µm to 250 µm, in some embodiments. In some embodiments, the laser has a pulse time in a range from 0.1 ns to 2 ms. In some embodiments, the heat from the laser diffuses laterally a distance in a range from 0.1 µm to 10 µm.

An embodiment of the disclosure is a mask for extreme ultraviolet (EUV) lithography that includes a multilayer stack including alternating molybdenum (Mo) and silicon (Si) layers over a first surface of a mask substrate. The EUV mask also includes a capping layer disposed over the multilayer stack. The EUV mask further includes an absorption layer that has an image pattern formed therein and disposed over the capping layer. The EUV mask includes a border region surrounding the image pattern and having a trench, wherein the absorption layer, the capping layer and at least a portion of the multilayer stack are etched. The EUV mask also includes the border region that has concave sidewalls. In some embodiments, the protruding portion comprises a material selected from the group consisting of TaBO, TaBN, or a combination thereof. In some embodiments, the protruding portion further includes a tapered profile. In some embodiments, the protruding portion of the concave sidewalls includes a width in a range of 10 nm to 50 nm. In some embodiments, the EUV mask further includes an inter-diffused portion over the multilayer stack of the trench. In some embodiments, a portion of the multilayer stack is disposed over the substrate in the trench.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an extreme ultraviolet (EUV) lithography mask, the method comprising:
    forming an image pattern in an absorption layer of EUV mask blank,
        the EUV mask blank including:
            a multilayer stack comprising alternating molybdenum (Mo) and silicon (Si) layers disposed over a first surface of a mask substrate;
            a capping layer disposed over the multilayer stack; and
            an absorption layer disposed over the capping layer;
    forming a border region surrounding the image pattern to form a trench wherein the absorption layer, the capping layer and a portion of the multilayer stack are etched and a part of the multilayer stack remains;
    forming concave sidewalls in the border region; and
    converting an entirety of the remaining part of the multilayer stack and a part of a sidewall of the trench into an inter-diffused portion,
    wherein the inter-diffused portion includes a non-periodic structure of silicon and molybdenum, thereby causing a reduced EUV reflectivity,
    the inter-diffused portion is in direct contact with the first surface of the mask substrate, and
    a periodic structure of the multilayer stack partially remains on the sidewall of the trench and is exposed to the trench.

2. The method of claim 1, wherein the concave sidewalls include a protruding portion.

3. The method of claim 2, wherein the protruding portion comprises a material selected from the group consisting of TaBO, TaBN, or a combination thereof.

4. The method of claim 2, wherein the protruding portion of the concave sidewalls have a width in a range from 10 nm to 50 nm.

5. The method of claim 2, wherein the protruding portion has a tapered profile.

6. The method of claim 1, wherein the concave sidewalls are formed by isotropically etching the multilayer stack.

7. The method of claim 1, wherein the inter-diffused portion is formed by a laser annealing operation.

8. The method of claim 1, wherein the remaining periodic structure is located at an upper part of the sidewall of the trench and in contact with the absorption layer.

9. The method of claim 8, wherein the inter-diffused portion has a U-shape cross section.

10. A method of manufacturing an extreme ultraviolet (EUV) lithography mask, the method comprising:
    forming an image pattern in an absorption layer of EUV mask blank,
        the EUV mask blank including:
            a multilayer stack comprising alternating molybdenum (Mo) and silicon (Si) layers disposed over a first surface of a mask substrate;
            a capping layer disposed over the multilayer stack; and
            an absorption layer disposed over the capping layer;
    forming a border region surrounding the image pattern having a trench wherein the absorption layer, the capping layer and a portion of the multilayer stack are etched and a part of the multilayer stack remains; and
    converting an entirety of the remaining part of the multilayer stack and a part of a sidewall of the trench into an inter-diffused portion,
    wherein the inter-diffused portion includes a non-periodic structure of silicon and molybdenum, causing a reduced EUV reflectivity, and
    wherein a bottom surface of the border region is fully covered by the inter-diffused portion so that the inter-diffused portion is in direct contact with the first surface of the mask substrate, and a periodic structure of the multilayer stack partially remains on the sidewall of the trench and is exposed to the trench.

11. The method of claim 10, wherein the inter-diffused portion is formed by a laser annealing operation.

12. The method of claim 11, wherein the laser has a wavelength in a range from 266 nm to 1523 nm.

13. The method of claim 11, wherein the laser has a resolution in a range from 0.1 µm to 250 µm.

14. The method of claim 11, wherein the laser has a pulse time in a range from 0.1 ns to 2 ms.

15. The method of claim 11, wherein heat from the laser diffuses laterally a distance in a range from 0.1 µm to 10 µm.

16. A mask for extreme ultraviolet (EUV) lithography, the mask comprising:
    a multilayer stack comprising alternating molybdenum (Mo) and silicon (Si) layers disposed over a first surface of a mask substrate;
    a capping layer disposed over the multilayer stack;
    an absorption layer having an image pattern formed therein disposed over the capping layer;

a border region surrounding the image pattern having a trench wherein the absorption layer, the capping layer and at least a portion of the multilayer stack are etched, wherein the border region has concave sidewalls, and wherein an inter-diffused portion that includes a non-periodic structure of silicon and molybdenum, thereby causing a reduced EUV reflectivity, is disposed under a bottom of the trench, the inter-diffused portion is in direct contact with the first surface of the mask substrate, and a periodic structure of the multilayer stack partially remains on a sidewall of the trench and is exposed to the trench.

17. The mask of claim 16, wherein the concave sidewalls include at least one protruding portion comprising a material selected from the group consisting of TaBO, TaBN, or a combination thereof.

18. The mask of claim 17, wherein the at least one protruding portion has a tapered shape.

19. The mask of claim 17, wherein the at least one protruding portion of the concave sidewalls have a width in a range of 10 nm to 50 nm.

20. The mask of claim 16, further including an inter-diffused portion over the multilayer stack of the trench that is connected to the inter-diffused portion disposed over the bottom surface of the border region.

* * * * *